US012349793B2

United States Patent
Yang et al.

(10) Patent No.: US 12,349,793 B2
(45) Date of Patent: Jul. 8, 2025

(54) HANGING ASSEMBLY

(71) Applicant: Delta Electronics, Inc., Taoyuan (TW)

(72) Inventors: Ta-Jung Yang, Taoyuan (TW); Chun-Han Lin, Taoyuan (TW)

(73) Assignee: Delta Electronics, Inc., Taoyuan (TW)

( * ) Notice: Subject to any disclaimer, the term of this patent is extended or adjusted under 35 U.S.C. 154(b) by 112 days.

(21) Appl. No.: 18/074,310

(22) Filed: Dec. 2, 2022

(65) Prior Publication Data

US 2024/0040720 A1   Feb. 1, 2024

(30) Foreign Application Priority Data

Jul. 28, 2022   (CN) .......................... 202221966189.6

(51) Int. Cl.
*A47B 95/00* (2006.01)
*H02B 1/30* (2006.01)
*H05K 5/02* (2006.01)
*H02B 1/28* (2006.01)

(52) U.S. Cl.
CPC ......... *A47B 95/008* (2013.01); *H05K 5/0217* (2013.01); *H02B 1/28* (2013.01); *H02B 1/30* (2013.01); *H02B 1/306* (2013.01)

(58) Field of Classification Search
CPC .... H05K 5/0217; H05K 7/183; H05K 5/0214; A47B 95/008; A47B 96/067; A47B 96/06; A47B 47/03; H02B 1/28; H02B 1/30; H02B 1/40; H02B 13/00; H02B 1/26; H02B 1/013; H02B 1/014; H02B 1/306;

(Continued)

(56) References Cited

U.S. PATENT DOCUMENTS 3,182,846 A * 5/1965 La Kaff ................. H02B 1/012
                                                      220/4.28
3,487,446 A * 12/1969 Muller ................. A47B 95/008
                                                     248/222.41

(Continued)

FOREIGN PATENT DOCUMENTS

CN          201278616 Y        7/2009
CN          102686073 A        9/2012

(Continued)

*Primary Examiner* — Hiwot E Tefera
(74) *Attorney, Agent, or Firm* — KIRTON McCONKIE; Evan R. Witt

(57) ABSTRACT

The present invention provides a hanging assembly for a cabinet. The cabinet includes a first lateral plate for defining an accommodation space, and the first lateral plate includes an opening. The hanging assembly includes a first connecting component fixed to the cabinet and a second connecting component. The first connecting component includes a first main body and a convex portion. The first main body includes a first surface. The convex portion is disposed on the first surface and passes through the opening along a first direction. The second connecting component includes a second main body and a hanging component. The second main body includes a second surface, and the second surface is detachably connected to the convex portion through the opening. The first lateral plate is disposed between the first connecting component and the second connecting component. The hanging component is disposed on the second main body.

18 Claims, 13 Drawing Sheets

(58) Field of Classification Search
CPC . H02B 1/012; H02B 1/301; F16B 9/05; F16B 9/054; F16B 9/056; F16B 12/42
USPC .................................. 312/245; 248/610, 612
See application file for complete search history.

(56) References Cited

U.S. PATENT DOCUMENTS

| | | | | |
|---|---|---|---|---|
| 4,291,817 A * | 9/1981 | Spitzer | ................. | H05K 9/0015 174/382 |
| 4,323,213 A * | 4/1982 | Rock | ................... | A47B 95/008 248/223.41 |
| 4,576,355 A * | 3/1986 | Graf | ................... | A47B 95/008 248/223.41 |
| 4,691,644 A * | 9/1987 | Frydman | ................ | A47B 47/03 312/265.5 |
| 5,292,189 A * | 3/1994 | Lau | ....................... | H02B 1/301 312/334.6 |
| 5,307,598 A * | 5/1994 | West | ....................... | E01F 9/642 232/39 |
| 5,433,516 A * | 7/1995 | Beals | ................... | A47B 88/493 312/263 |
| 5,474,395 A * | 12/1995 | Miki | .................... | A47B 96/066 108/158 |
| 5,513,759 A * | 5/1996 | Besserer | ................. | F16M 1/00 312/265.2 |
| 5,584,406 A * | 12/1996 | Besserer | ................ | H02B 1/301 312/265.2 |
| 5,718,493 A * | 2/1998 | Nikolai | ................ | A47B 88/941 403/68 |
| 6,270,283 B1 * | 8/2001 | Turati | .................... | H02B 1/301 403/219 |
| 6,299,268 B1 * | 10/2001 | Carle | ...................... | H02B 1/01 312/265.4 |
| 6,536,858 B1 * | 3/2003 | Heidmann | ........... | A47B 95/008 52/36.6 |
| 9,512,637 B2 * | 12/2016 | Ramsauer | ............. | F16B 5/0642 |
| 10,206,506 B1 * | 2/2019 | Lai | ..................... | A47B 96/1433 |
| 10,874,036 B2 | 12/2020 | Yang et al. | | |
| 2008/0202039 A1 * | 8/2008 | Picchio | ..................... | E04B 2/74 52/36.5 |
| 2008/0272677 A1 * | 11/2008 | Francisquini | ......... | H02B 1/301 312/257.1 |
| 2011/0309046 A1 * | 12/2011 | Lee | ....................... | A47B 47/03 211/182 |
| 2018/0042378 A1 * | 2/2018 | Kilburn | .................. | E05D 15/58 |
| 2019/0085886 A1 * | 3/2019 | Davis | ..................... | F16B 21/09 |
| 2022/0312964 A1 * | 10/2022 | Kressin | ................ | A47B 96/066 |

FOREIGN PATENT DOCUMENTS

| | | | | |
|---|---|---|---|---|
| CN | 202799464 U | 3/2013 | | |
| CN | 204012253 U | 12/2014 | | |
| CN | 204216423 U | 3/2015 | | |
| CN | 108124396 B | 6/2021 | | |
| CN | 216850959 U | 6/2022 | | |
| EP | 1472956 A1 * | 11/2004 | .......... | A47B 95/008 |
| JP | H0937419 A | 2/1997 | | |
| WO | 9517082 A1 | 6/1995 | | |

* cited by examiner

HANGING ASSEMBLY

CROSS-REFERENCE TO RELATED APPLICATION

This application claims priority to China Patent Application No. 202221966189.6, filed on Jul. 28, 2022, the entire contents of which are incorporated herein by reference for all purposes.

FIELD OF THE INVENTION

The present disclosure relates to a hanging assembly for a cabinet, and more particularly to a hanging assembly for preventing water leakage from the cabinet and facilitating assembling/disassembling and maintenance.

BACKGROUND OF THE INVENTION

In modern industry, the cabinet is used for outdoor storage of devices such as communication devices, power supply devices and energy storage devices. However, since the cabinet with the devices accommodated therein is weighted at least several hundred kilograms, the hanging assembly is required for the cabinet to be moved and transported by means of hanging.

There are two types of the hanging assemblies for the cabinets. One is the hanging assembly fixed to the cabinet through the fixing hole on the cabinet top surface, and the other one is the hanging assembly welded directly to the cabinet housing. However, when the hanging assembly fixed through the fixing hole is hung, the fixing hole on the cabinet top surface will easily break under stress. Since the defect will further lead to water leakage from the cabinet top surface, the cabinet with the hanging assembly fixed through the fixing hole is not suitable for an outdoor environment. As to the hanging assembly welded directly to the cabinet housing, although the arrangement thereof prevents the cabinet from water leakage, there is no other reliable support between the hanging assembly and the cabinet. Furthermore, the welded hanging assembly is difficult to be replaced when it is deformed or damaged, and the maintenance cost is raised.

Therefore, there is a need to provide a hanging assembly for moving and transporting a cabinet, preventing water leakage from the cabinet and facilitating assembling/disassembling and maintenance so as to solve the problems stated above.

SUMMARY OF THE INVENTION

An object of the present disclosure is to provide a hanging assembly for preventing water leakage from a cabinet and facilitating assembling/disassembling and maintenance. The hanging assembly includes a first connecting component and a second connecting component. The first connecting component is fixed to the cabinet, and the second connecting component includes a hanging component. A convex portion of the first connecting component is detachably connected to the second connecting component through an opening disposed on a cabinet lateral plate. The hanging assembly constructed by two detachably connected components facilitates the replacement of the components when the components are damaged. Furthermore, with the opening disposed on the cabinet lateral plate, the opening is not easily broken by stress generated during hanging, and the risk of water leakage is further reduced. The convex portion of the first connecting component passes through an elastic body disposed between the first connecting component and the cabinet lateral plate, so as to block external materials from entering the internal space of the cabinet. The sealing performance is improved, and the occurrence of water leakage is further prevented. The cabinet further includes a spacer pushing against the cabinet lateral plate. With the spacer, the elastic body is prevented from being overly compressed by the cabinet lateral plate, and the sealing performance is ensured. A first top plate of the cabinet covers the first connecting component and the cabinet lateral plate from above the cabinet to provide water resistance. Furthermore, the first top plate is partially attached to the outer side of the cabinet lateral plate, and the thickness of the convex portion is greater than the sum of the thickness of the elastic body, the thickness of the cabinet lateral plate and the thickness of the first top plate. With the specific thickness configuration, the first connecting component and the second connecting component are attached to each other when they are fixed, and the stability of the hanging assembly is improved. For further improving the waterproof performance, the cabinet includes a second top plate disposed above the cabinet and covering the first top plate and the second connecting component. In addition, the second top plate is partially sandwiched between a cabinet door and a cabinet main body, so that when the cabinet door is closed and fixed, the second top plate is kept covering the hanging assembly and cannot be detached from the cabinet body. Therefore, the anti-theft effect is achieved.

In accordance with an aspect of the present disclosure, a hanging assembly for a cabinet is provided. The cabinet includes a first lateral plate for defining an accommodation space, and the first lateral plate includes an opening. The hanging assembly includes a first connecting component and a second connecting component. The first connecting component is fixed to the cabinet, and includes a first main body and a convex portion. The first main body includes a first surface. The convex portion is disposed on the first surface, and the convex portion passes through the opening of the first lateral plate along a first direction. The second connecting component includes a second main body and a hanging component. The second main body includes a second surface detachably connected to the convex portion of the first connecting component through the opening of the first lateral plate. The first lateral plate is disposed between the first connecting component and the second connecting component. The hanging component is disposed on the second main body.

In an embodiment, the hanging assembly includes an elastic body disposed between the first connecting component and the first lateral plate. The convex portion has a first thickness, the elastic body has a second thickness, and the first lateral plate has a third thickness. When the first lateral plate is fixed to the cabinet, the first thickness is greater than a sum of the second thickness and the third thickness.

In an embodiment, the cabinet further includes a first top plate. The first top plate covers the first connecting component of the hanging assembly and the first lateral plate along a second direction. The first lateral plate is attached to the first top plate along the first direction. The second direction is perpendicular to the first direction.

In an embodiment, the first top plate includes a fourth thickness. The first thickness is greater than a sum of the second thickness, third thickness and the fourth thickness.

In an embodiment, the cabinet further includes a second top plate. The second top plate covers the first top plate and the hanging assembly along the second direction.

In an embodiment, the cabinet further includes a second lateral plate. The second lateral plate at least partially covers the hanging assembly and the second top plate along a third direction. The second lateral plate is configured to be opened or closed, so as to expose or shelter the accommodation space of the cabinet. The third direction is perpendicular to the first direction and the second direction.

In an embodiment, the cabinet further includes a spacer. The spacer has a fifth thickness. When the first lateral plate is fixed to the cabinet, the spacer pushes against the first lateral plate.

In an embodiment, the hanging assembly includes a fixing component, the first connecting component includes a first fixing hole, and the second connecting component includes a second fixing hole. The fixing component is engaged with the first fixing hole and the second fixing hole, respectively.

In an embodiment, the first connecting component is fixed to the cabinet by a welding method.

In an embodiment, the first connecting component is fixed to the cabinet through the accommodation groove.

In accordance with another aspect of the present disclosure, a hanging assembly for a cabinet is provided. The cabinet includes a first lateral plate for defining an accommodation space, and the first lateral plate includes an opening. The hanging assembly includes a first connecting component and a second connecting component. The first connecting component is fixed to the cabinet. The first connecting component includes a first main body and a convex portion. The first main body includes a first surface. The convex portion is disposed on the first surface, and the convex portion passes through the opening of the first lateral plate along a first direction. The second connecting component includes a second main body, a hanging component and a hanging-component fixing hole. The second main body includes a second surface, and the second surface of the second main body is detachably connected to the convex portion of the first connecting component through the opening of the first lateral plate. The first lateral plate is disposed between the first connecting component and the second connecting component. The hanging component is disposed on the second main body. The hanging component is detachably connected to the second main body through the hanging-component fixing hole.

In an embodiment, the hanging assembly includes an elastic body disposed between the first connecting component and the first lateral plate. The convex portion has a first thickness, the elastic body has a second thickness, and the first lateral plate has a third thickness. When the first lateral plate is fixed to the cabinet, the first thickness is greater than a sum of the second thickness and the third thickness.

In an embodiment, the cabinet further includes a first top plate. The first top plate covers the first connecting component of the hanging assembly and the first lateral plate along a second direction. The first lateral plate is attached to the first top plate along the first direction. The second direction is perpendicular to the first direction.

In an embodiment, the first top plate includes a fourth thickness. The first thickness is greater than a sum of the second thickness, third thickness and the fourth thickness.

In an embodiment, the cabinet further includes a second top plate. The second top plate covers the first top plate and the hanging assembly along the second direction.

In an embodiment, the cabinet further includes a second lateral plate. The second lateral plate at least partially covers the hanging assembly and the second top plate along a third direction. The second lateral plate is configured to be opened or closed, so as to expose or shelter the accommodation space of the cabinet. The third direction is perpendicular to the first direction and the second direction.

In an embodiment, the cabinet further includes a spacer. The spacer has a fifth thickness. When the first lateral plate is fixed to the cabinet, the spacer pushes against the first lateral plate.

In an embodiment, the hanging assembly includes a fixing component, the first connecting component includes a first fixing hole, and the second connecting component includes a second fixing hole. The fixing component is engaged with the first fixing hole and the second fixing hole, respectively.

In an embodiment, the first connecting component is fixed to the cabinet by a welding method.

In an embodiment, the first connecting component is fixed to the cabinet through the accommodation groove.

DETAILED DESCRIPTION OF THE PREFERRED EMBODIMENT

Figure 1:
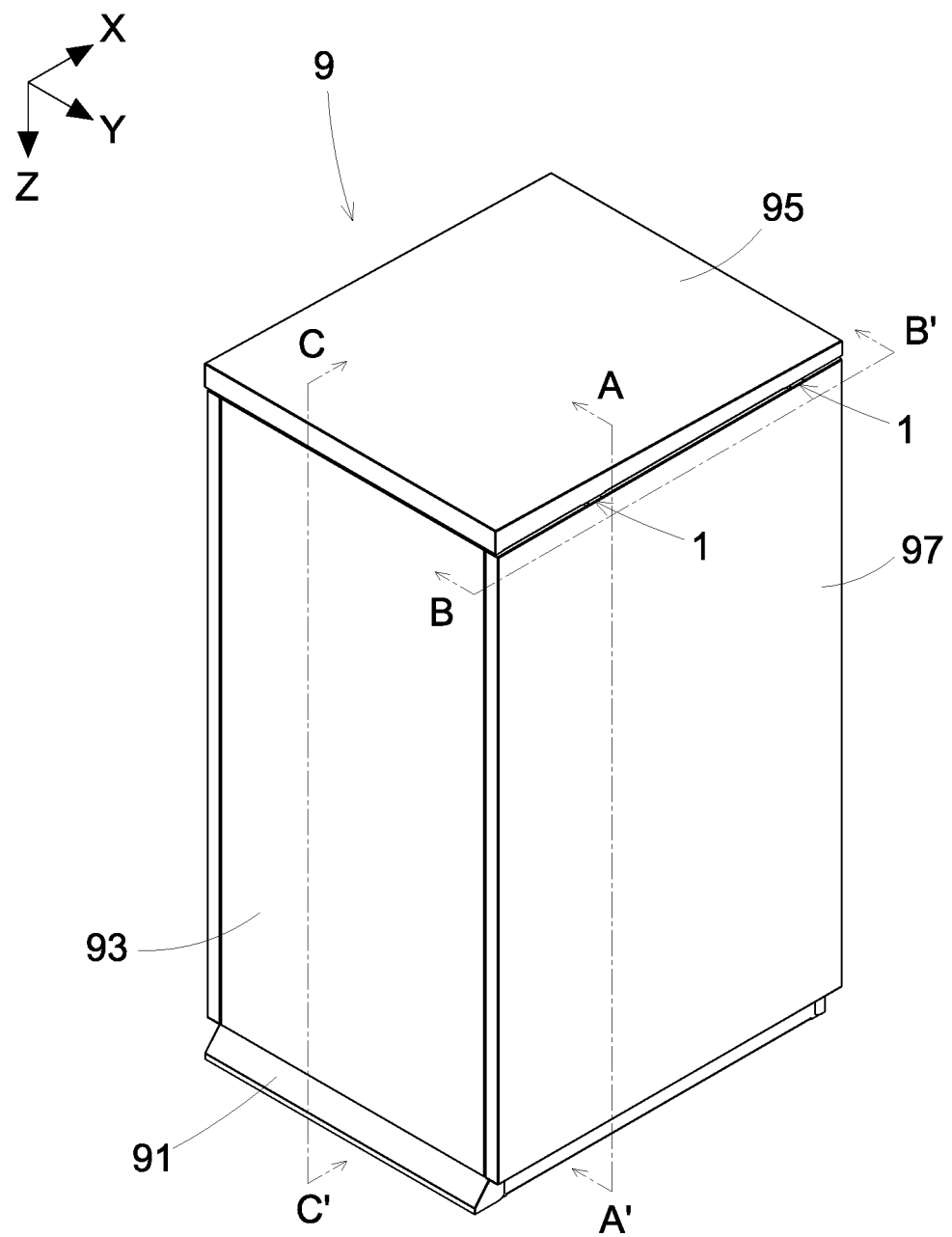
FIG. 1 is a schematic view illustrating a hanging assembly and a cabinet according to a first embodiment of the present disclosure.

The present disclosure will now be described more specifically with reference to the following embodiments. It is to be noted that the following descriptions of preferred embodiments of this invention are presented herein for purpose of illustration and description only. It is not intended to be exhaustive or to be limited to the precise form disclosed. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. When an element is referred to as being "connected," or "coupled," to another element, it can be directly connected or coupled to the other element or intervening elements may be present. Although the wide numerical ranges and parameters of the present disclosure are approximations, numerical values are set forth in the specific examples as precisely as possible. In addition, although the "first," "second," "third," and the like terms in the claims be used to describe the various elements can be appreciated, these elements should not be limited by these terms, and these elements are described in the respective embodiments are used to express the different reference numerals, these terms are only used to distinguish one element from another element. For example, a first element could be termed a second element, and, similarly, a second element could be termed a first element, without departing from the scope of example embodiments.

Figure 2:
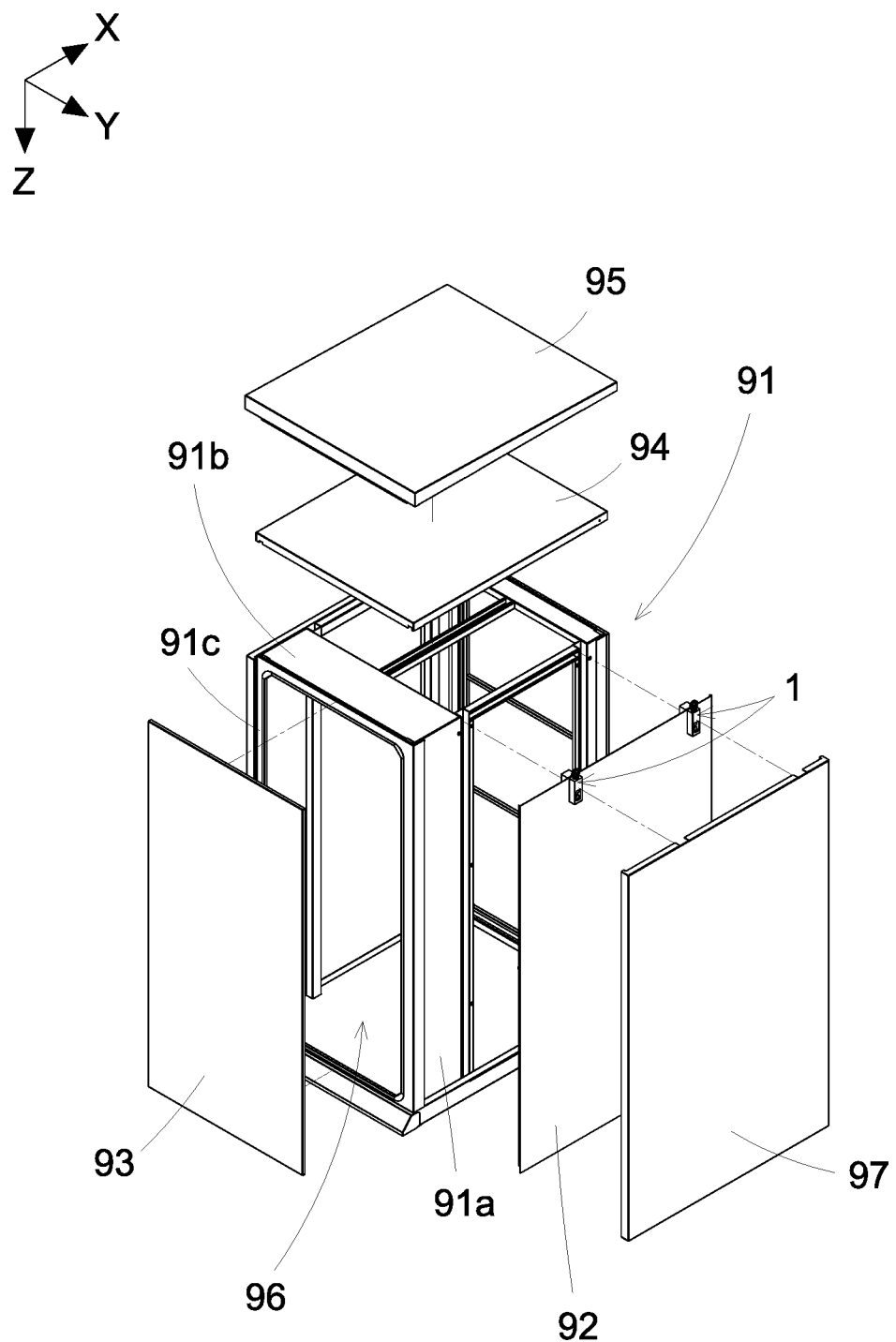
FIG. 2 is an exploded view illustrating the hanging assembly and the cabinet according to the first embodiment of the present disclosure.

Please refer to FIGS. 1 to 2. FIG. 1 is a schematic view illustrating a hanging assembly and a cabinet according to a first embodiment of the present disclosure. FIG. 2 is an exploded view illustrating the hanging assembly and the cabinet according to the first embodiment of the present disclosure. In the embodiment, the cabinet 9 includes a cabinet main body 91, a first lateral plate 92, a second lateral plate 93, a first top plate 94 and a second top plate 95. An accommodation space 96 of the cabinet 9 is defined by the lateral plates and the top plates. Preferably but not exclusively, the accommodation space 96 is configured to accommodate electronic components such as power supplies or energy storage components. The cabinet main body 91 includes a first lateral surface 91a, a top surface 91b and a second lateral surface 91c. The first lateral plate 92 is disposed on the first lateral surface 91a. The first lateral plate 92 includes a first side 921, a second side 922 and two openings 923. The first side 921 and the second side 922 are opposite to each other, and the two openings 923 are connected between the first side 921 and the second side 922, respectively. In the embodiment, two hanging assemblies 1 are disposed at two opposite sides of an upper edge of the first lateral plate 92 through the two openings 923, respectively. Notably, the number and the position of the hanging assemblies 1 and the first lateral plates 92 applied to each cabinet are not limited thereto, and are adjustable according to practical requirements. In other embodiments, the cabinet 9 includes two first lateral plates 92 disposed symmetrically with the cabinet main body 91 as the center. Two hanging assemblies are disposed at two opposite sides of the upper edge of each first lateral plate 92, respectively. In the embodiment, the cabinet 9 further includes an outer cover plate 97 for covering the first lateral plate 92 and the hanging assembly 1. The present disclosure is not limited thereto, and is not redundantly described herein.

Figure 3A:
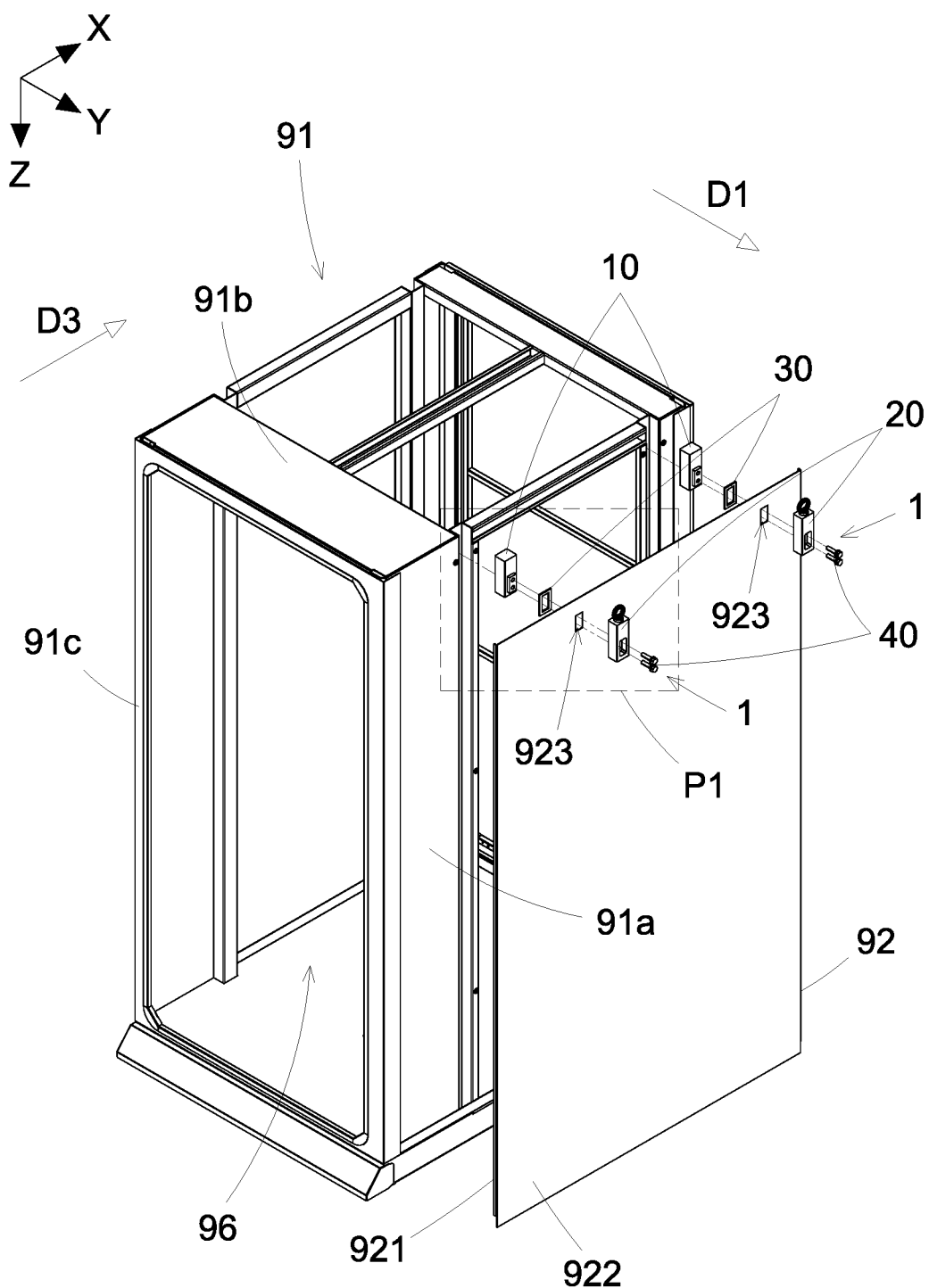
FIG. 3A is an exploded view illustrating the hanging assembly, a cabinet main body and a first lateral plate according to the first embodiment of the present disclosure.
Figure 3B:
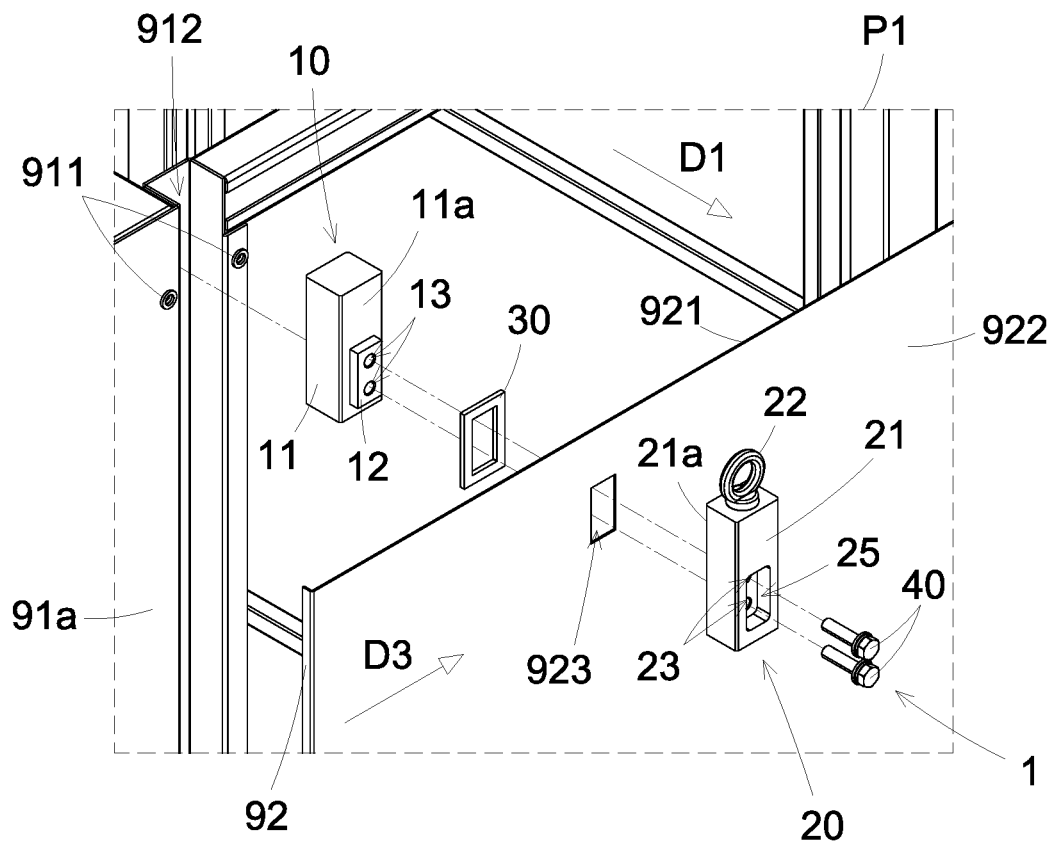
FIG. 3B is an enlarged view of a region P1 shown in FIG. 3A.

Please refer to FIGS. 3A to 3B. FIG. 3A is an exploded view illustrating the hanging assembly, a cabinet main body and a first lateral plate according to the first embodiment of the present disclosure. FIG. 3B is an enlarged view of a region P1 shown in FIG. 3A. In the embodiment, the hanging assembly 1 includes a first connecting component 10 and a second connecting component 20. The first connecting component 10 is fixed to the cabinet 9 and includes a first main body 11 and a convex portion 12. The first main body 11 includes a first surface 11a. In the embodiment, the first connecting component 10 is disposed at the first side 921 of the first lateral plate 92 and connected to the cabinet main body 91 of the cabinet 9. The convex portion 12 is disposed on the first surface 11a, and the convex portion 12 passes through the opening 923 of the first lateral plate 92 along a first direction D1 (i.e., the Y-axis direction). In the embodiment, the first direction D1 (i.e., the Y-axis direction) is a direction oriented from the first connecting component 10 to the second connecting component 20. The second connecting component 20 includes a second main body 21 and a hanging component 22. The second main body 21 includes a second surface 21a, and the second surface 21a of the second main body 21 is detachably connected to the convex portion 12 of the first connecting component 10 through the opening 923 of the first lateral plate 92. In the embodiment, the first surface 11a of the first main body 11 and the second surface 21a of the second main body 21 are opposite to each other along the first direction D1 (i.e., the Y-axis direction). The first lateral plate 92 is disposed between the first connecting component 921 and the second connecting component 923, and the second connecting component 923 is disposed on the second side 922 of the first lateral plate 92. The hanging component 22 is disposed on the second main body 21. In the embodiment, the second main body 21 and the hanging component 22 are integrally formed into one piece.

In the embodiment, the first connecting component 10 is fixed to the cabinet main body 91 of the cabinet 9 by a welding method. The cabinet main body 91 of the cabinet further includes an accommodation groove 912, and the first connecting component 10 is fixed to the cabinet main body 91 through the accommodation groove 912. In the embodiment, there are at least eight seams between the first connecting component 10 and the accommodation groove 912 for connecting the two to each other by the welding method. Furthermore, the eight seams include seams extended along the X-axis direction, the Y-axis direction and the Z-axis direction. Multiple welds extended along different directions facilitate providing support in different directions when the hanging assembly 1 is subjected to stress. Accordingly, the stability of the hanging assembly 1 is improved. In other embodiments, the first connecting component 10 is fixed to the cabinet 9 through connecting with the accommodation groove 912 by a snap fastener or a screw. The present disclosure is not limited thereto. In the embodiment, the hanging assembly 1 includes an elastic body 30 disposed between the first connecting component 10 and the first lateral plate 92. The convex portion 12 of the first connecting component 10 passes through the elastic body 30 along the first direction D1 (Y-axis direction). In the embodiment, an inner edge of the elastic body 30 is further attached to an outer edge of the convex portion 12, so as to improve the waterproof performance of the hanging assembly 1.

Figure 4A:
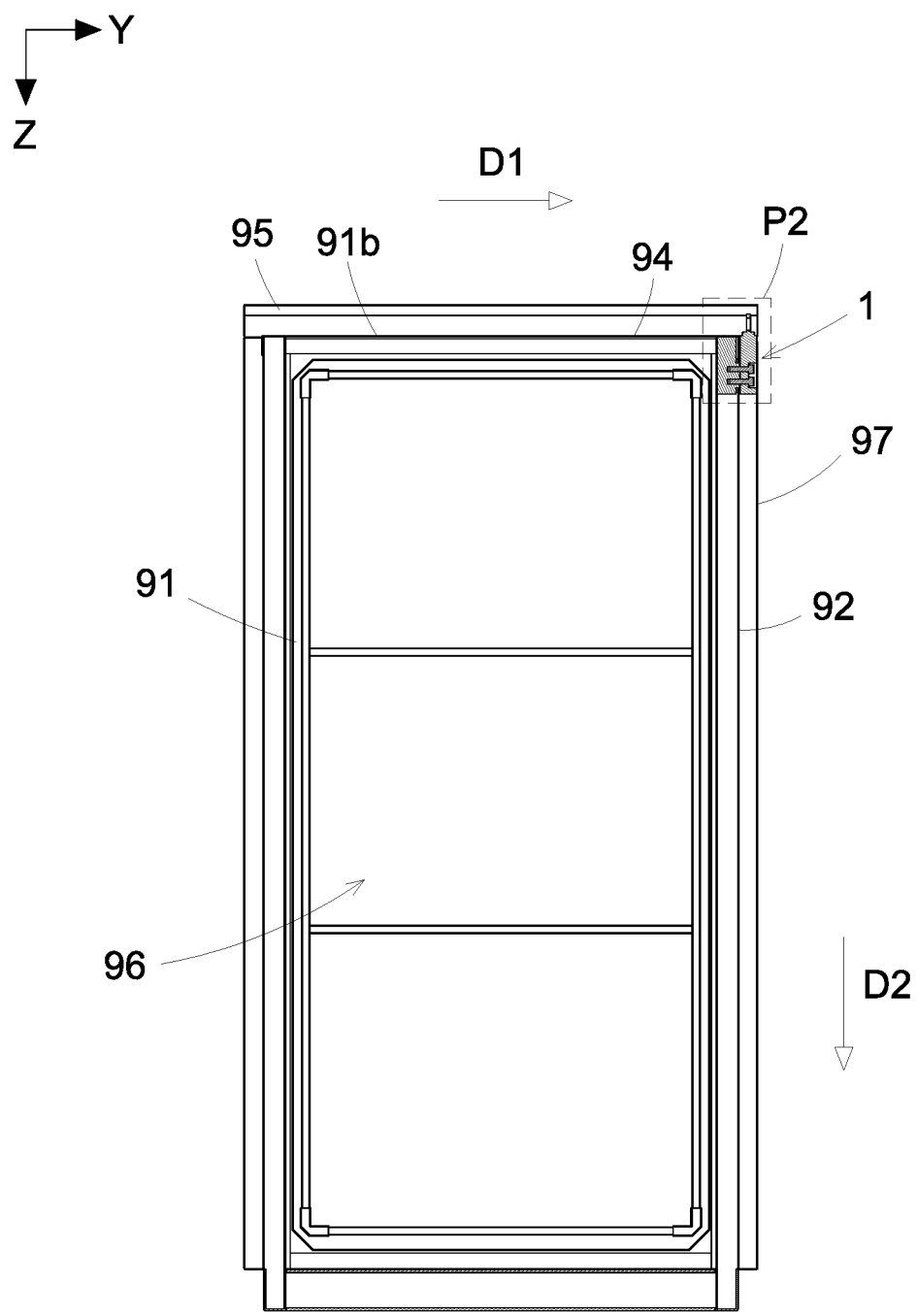
FIG. 4A is a cross-sectional structure of the hanging assembly and the cabinet along a line A-A' shown in FIG. 1.
Figure 4B:
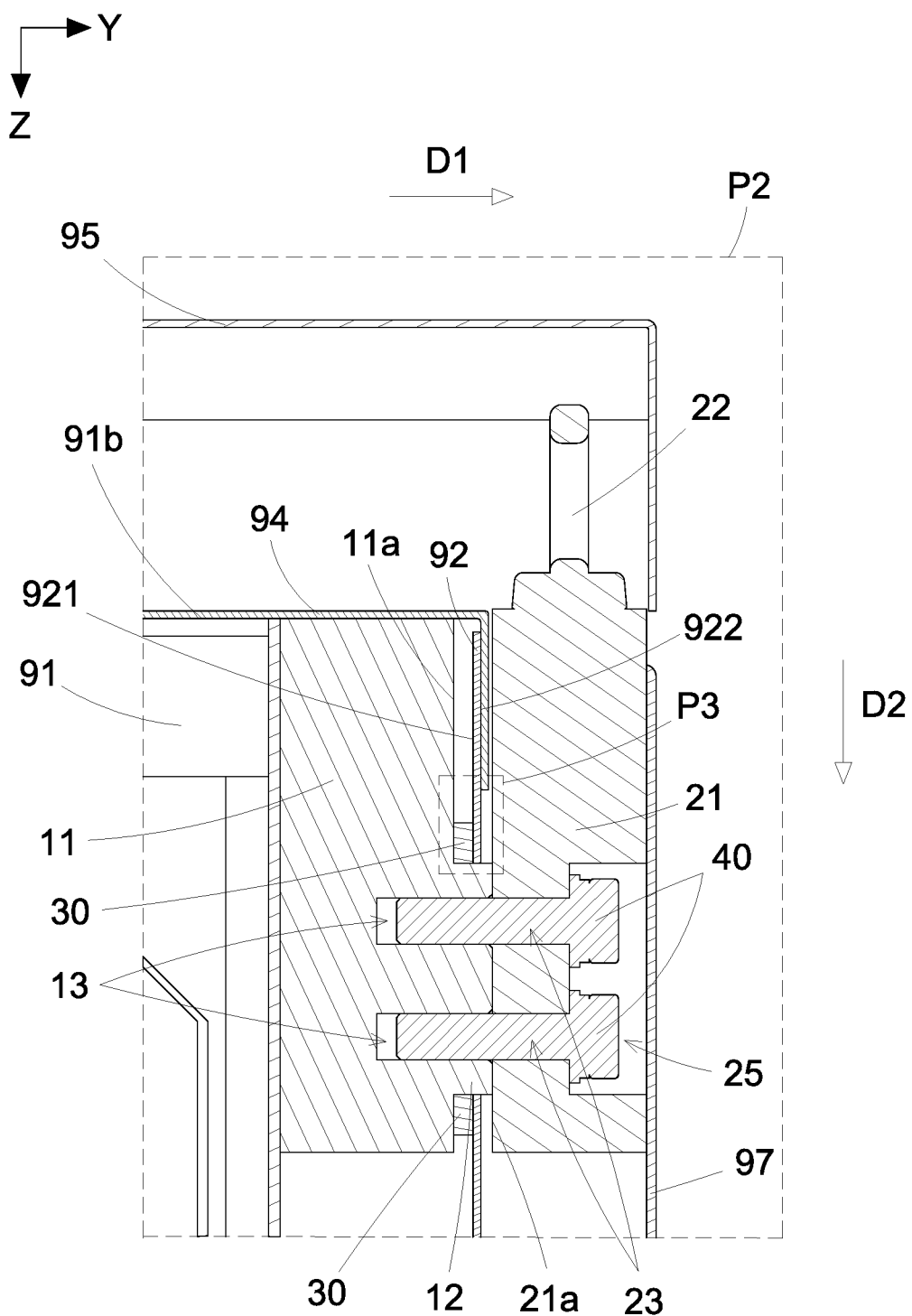
FIG. 4B is an enlarged view of a region P2 shown in FIG. 4A.

Refer to FIGS. 4A to 4B. FIG. 4A is a cross-sectional structure of the hanging assembly and the cabinet along a line A-A' shown in FIG. 1. FIG. 4B is an enlarged view of a region P2 shown in FIG. 4A. in the embodiment, the hanging assembly 1 includes a fixing component 40, the first connecting component 10 includes a first fixing hole 13, and the second connecting component 20 includes a second fixing hole 23. The first fixing hole 13 is disposed on the convex portion 12, and the second fixing hole 23 is disposed on the second main body 21. The fixing component 40 is engaged with the first fixing hole 13 and the second fixing hole 23, respectively. In the embodiment, the cabinet 9 further includes a first top plate 94 disposed on a top surface 91b of the cabinet main body 91. The first top plate 94 is at least partially attached to the second side 922 of the first lateral plate 92. In the embodiment, the fixing component 40 passes through the second fixing hole 23 and the opening 923 along the first direction D1 (i.e., the Y-axis direction), and is partially accommodated in the first fixing hole 13. Preferably but not exclusively, the fixing component 40 includes two screws, and the first fixing hole 13 and the second fixing hole 23 include two screw holes, respectively. The two screw holes of the first fixing hole 13 are disposed on the first surface 11a of the first main body 11 along a second direction D2 (i.e., the Z-axis direction). The two screw holes of the second fixing hole 23 pass through the second main body 21 along the first direction D1 (i.e., the Y-axis direction). Moreover, the second fixing hole 23 are disposed correspondingly to the two screw holes of the first fixing hole 13 along the first direction D1 (i.e., the Y-axis direction). Certainly, the specific form, position and number of the fixing component 40, the first fixing hole 13 and the second fixing hole 23 are not limited thereto but adjustable according to practical requirements, and not redundantly described herein.

In the embodiment, the second connecting component 20 further includes a concave portion 25. When the first connecting component 10 and the second connecting component 20 are fixed by the fixing component 40, the fixing component 40 is partially accommodated in the concave portion 25 instead of protruding from the second connecting component 20 along the first direction D1 (i.e., the Y-axis direction). Thereby, the flat surface and the aesthetic appearance of the hanging assembly 1 is ensured, and the flat surface further facilitates matching the cabinet component, such as the outer cover plate 97, to the hanging assembly 1.

Figure 4C:
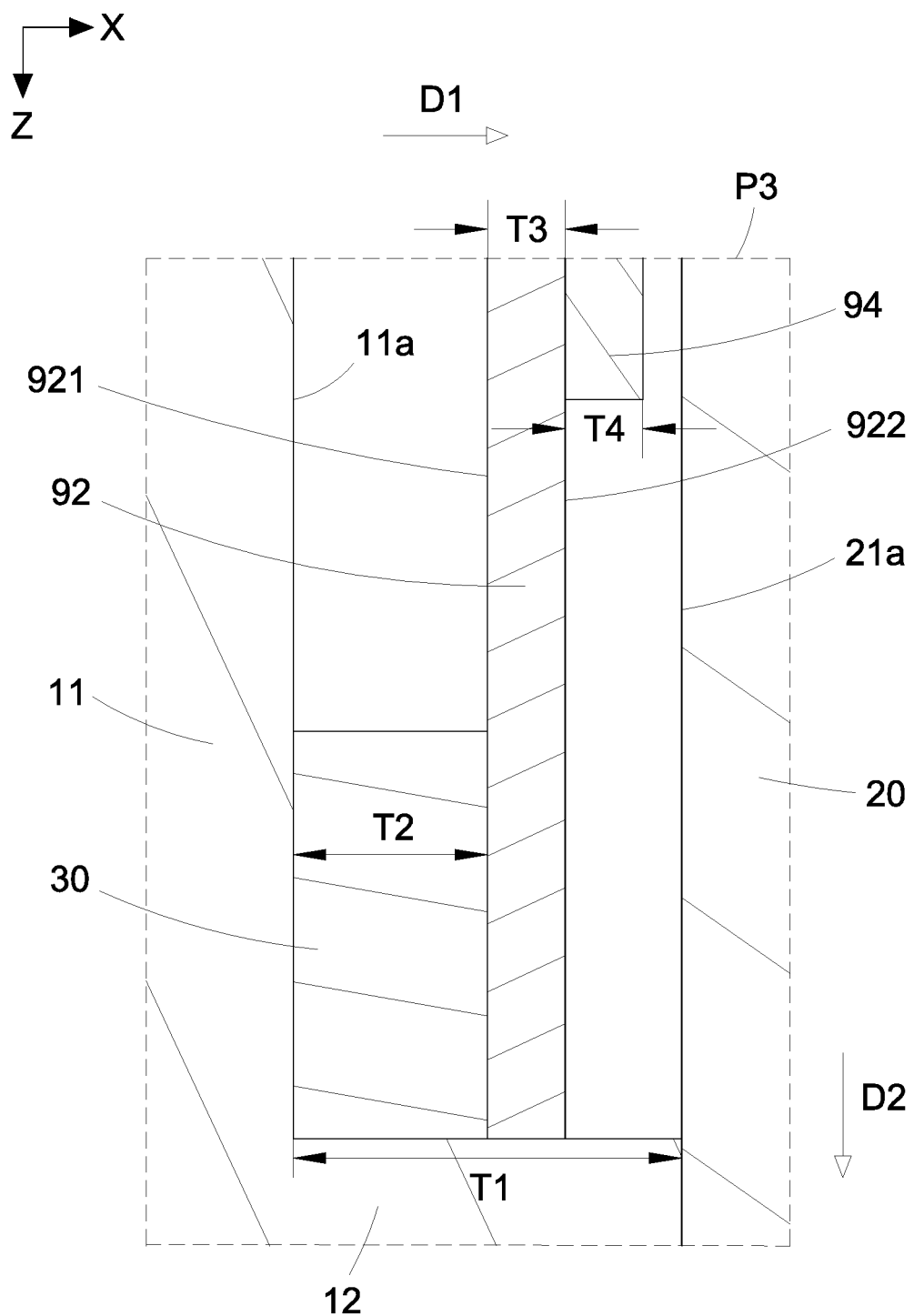
FIG. 4C is an enlarged view of a region P3 shown in FIG. 4B.

Please refer to FIG. 4C. FIG. 4C is an enlarged view of a region P3 shown in FIG. 4B. In the embodiment, the convex portion 12 has a first thickness T1, the elastic body 30 has a second thickness T2, and the first lateral plate 92 has a third thickness T3. When the first lateral plate 92 is fixed to the cabinet 9, the first thickness T1 is greater than a sum of the second thickness T2 and the third thickness T3. Preferably but not exclusively, the first top plate 94 further includes a fourth thickness T4, and the first thickness T1 is greater than a sum of the second thickness T2, third thickness T3 and the fourth thickness T4. The first surface 11a of the first main body 11 and the first side 921 of the first lateral plate 92 are attached to two opposite surfaces of the elastic body 30, respectively. Moreover, the first top plate 94 is attached to the second side 922 of the first lateral plate 92. With the compactly arranged components, the stability of the hanging assembly 1 is improved, and the possibility of water leakage is reduced.

Figure 5A:
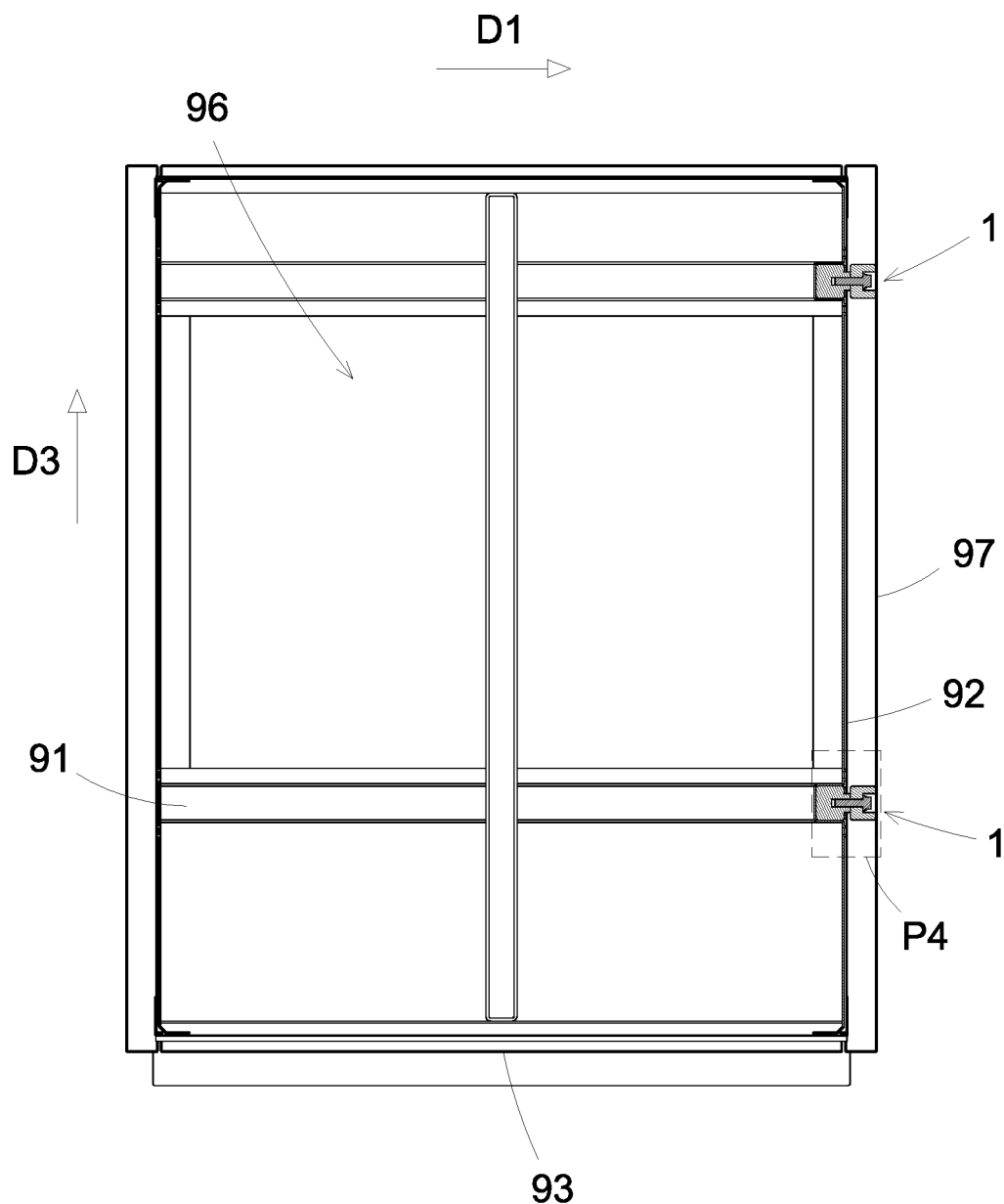
FIG. 5A is a cross-sectional structure of the hanging assembly and the cabinet along a line B-B' shown in FIG. 1.
Figure 5B:
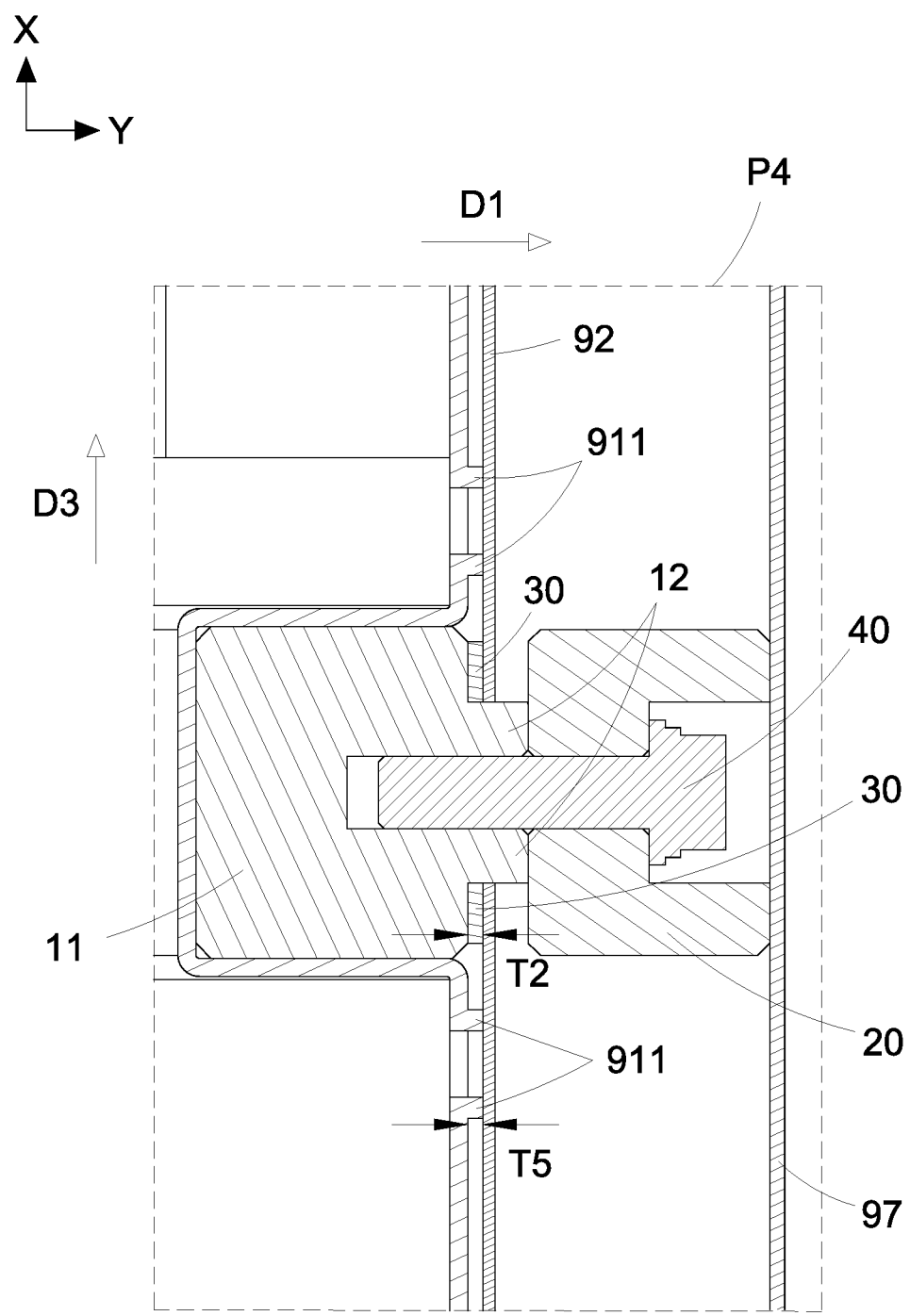
FIG. 5B is an enlarged view of a region P4 shown in FIG. 5A.

Please refer to FIGS. 5A to 5B. FIG. 5A is a cross-sectional structure of the hanging assembly and the cabinet along a line B-B' shown in FIG. 1. FIG. 5B is an enlarged view of a region P4 shown in FIG. 5A. In the embodiment, the cabinet 9 includes a spacer 911 having a fifth thickness T5. When the first lateral plate 92 is fixed to the cabinet 9, the spacer 911 pushes against the first lateral plate 92 along the first direction D1 (i.e., the Y-axis direction). The spacer 911 is disposed on the first lateral surface 91a and extended along the first direction D1 (i.e., the Y-axis direction). Preferably but not exclusively, the fifth thickness T5 of the spacer 911 is equal to the second thickness T2 of the elastic body 30. In the embodiment, the spacer 911 includes two spacers 911. The two spacers 911 are disposed on the first lateral surface 91a along a third direction D3 (i.e., the X-axis direction), and are disposed at two opposite sides of the first connecting component 10, respectively. Thereby, the first lateral plate 92 is pushed against evenly. In other embodiments, two spacers 911 are further disposed symmetrically with the first connecting component 10 as the center. Notably, the number and the disposed form of the spacers 911 are not limited thereto but adjustable according to practical requirements, and not redundantly described herein.

Figure 6A:
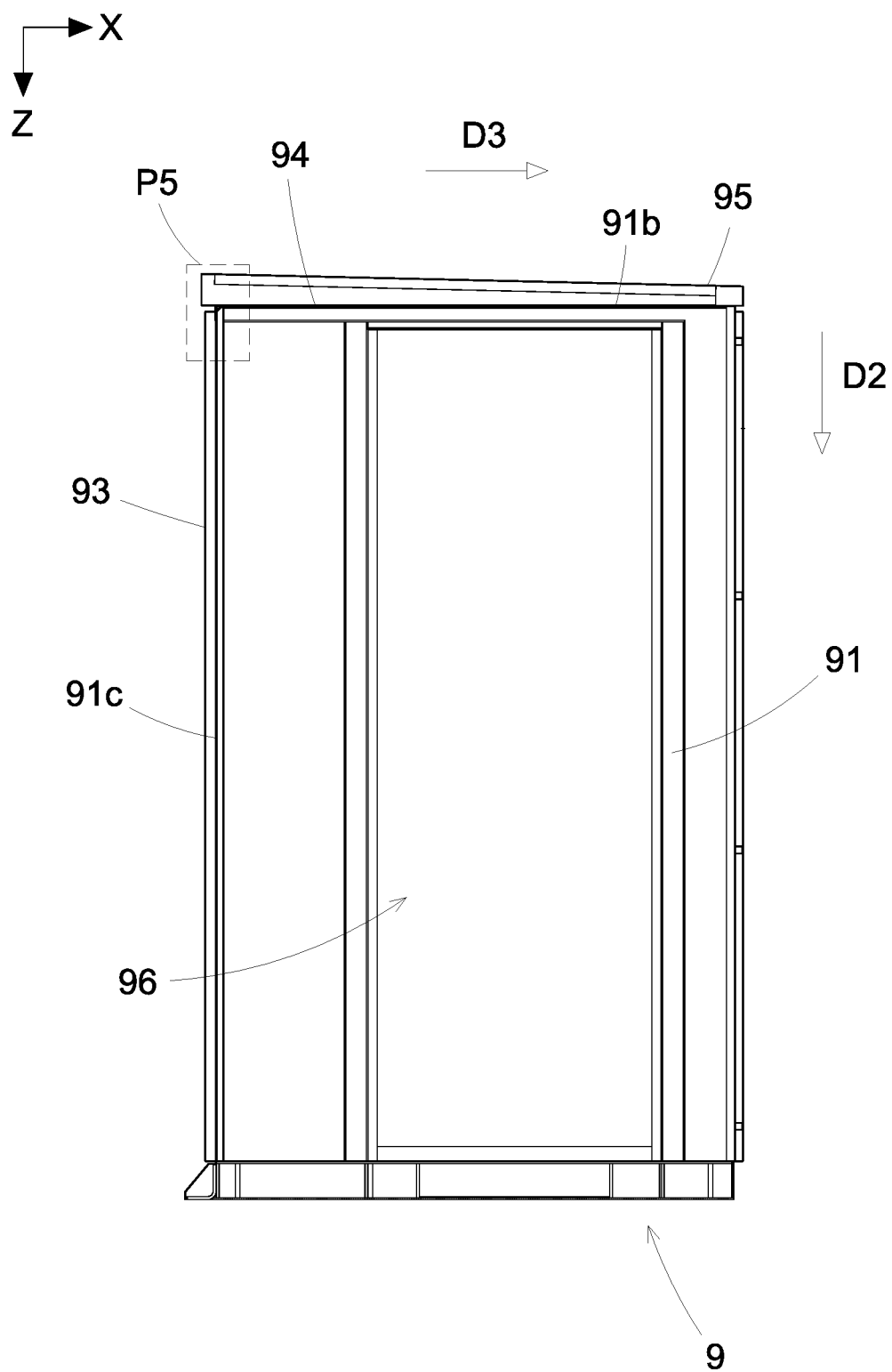
FIG. 6A is a cross-sectional structure of the hanging assembly and the cabinet along a line C-C' shown in FIG. 1.
Figure 6B:
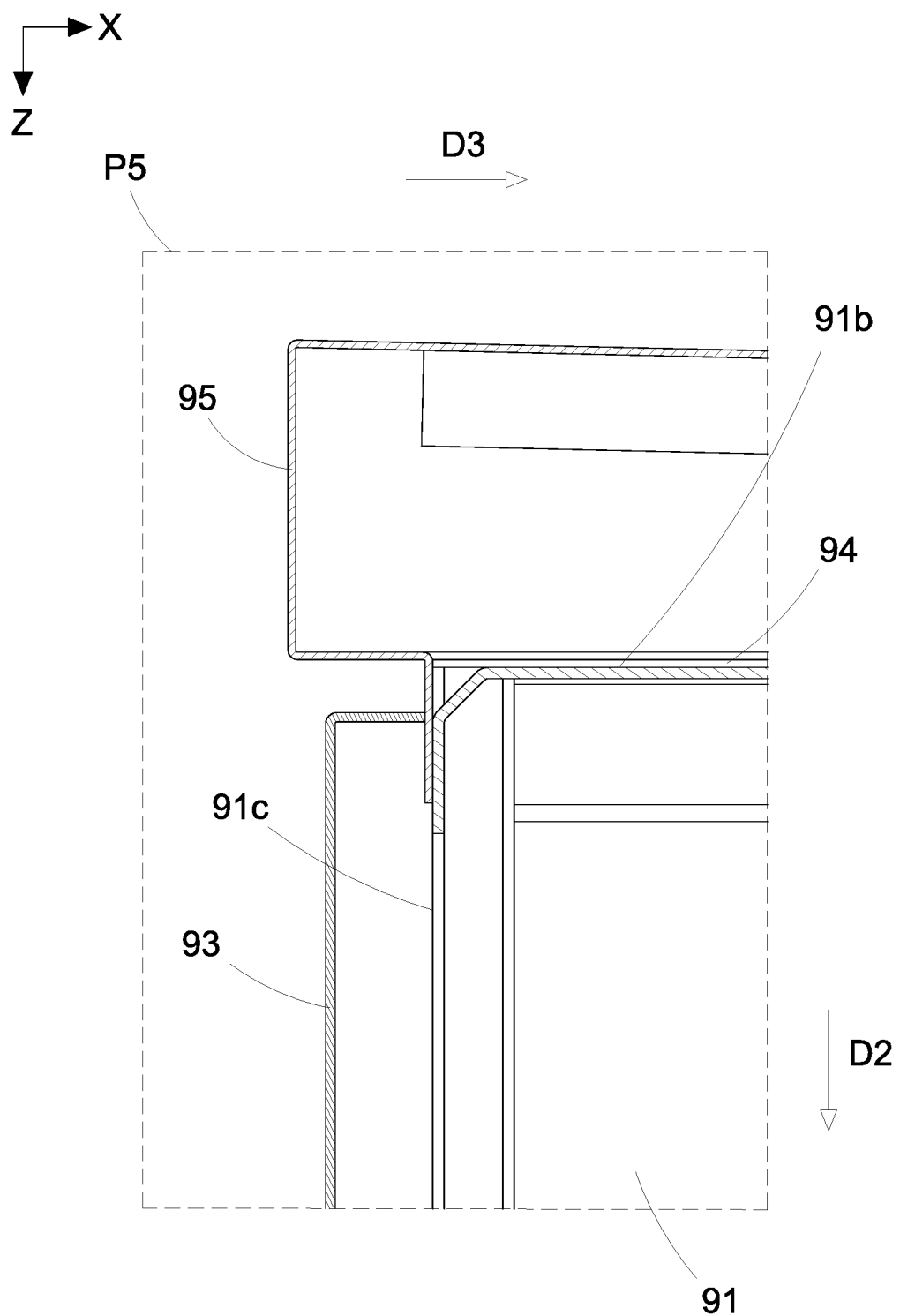
FIG. 6B is an enlarged view of a region P5 shown in FIG. 6A.

Please refer to FIGS. 6A to 6B. FIG. 6A is a cross-sectional structure of the hanging assembly and the cabinet along a line C-C' shown in FIG. 1. FIG. 6B is an enlarged view of a region P5 shown in FIG. 6A. In the embodiment, the cabinet 9 includes a second top plate 95. The second top plate 95 covers the first top plate 94 and the hanging assembly 1 along the second direction D2 (i.e., the Z-axis direction). In the embodiment, the second direction D2 (i.e., the Z-axis direction) is a direction oriented from the second top plate 95 to the top surface 91b. Preferably but not exclusively, the cabinet 9 further includes a second lateral plate 93. The second lateral plate 93 at least partially covers the hanging assembly 1 and the second top plate 95 along the third direction (i.e., the X-axis direction). The second lateral plate 95 is configured to be opened or closed, so as to expose or shelter the accommodation space 96 of the cabinet 9. In the embodiment, the third direction (i.e., the X-axis direction) is a direction oriented from the second lateral plate 93 to the second lateral surface 91c. Since the second top plate 95 is at least partially sandwiched between the second lateral plate 93 and the cabinet main body 91, when the second lateral plate 95 is closed to shelter the accommodation space 96 of the cabinet 9, the second top plate 95 is not able to be detached from the cabinet main body 91. The hanging assembly 1 is kept covered, and the anti-theft effect is achieved.

Figure 7A:
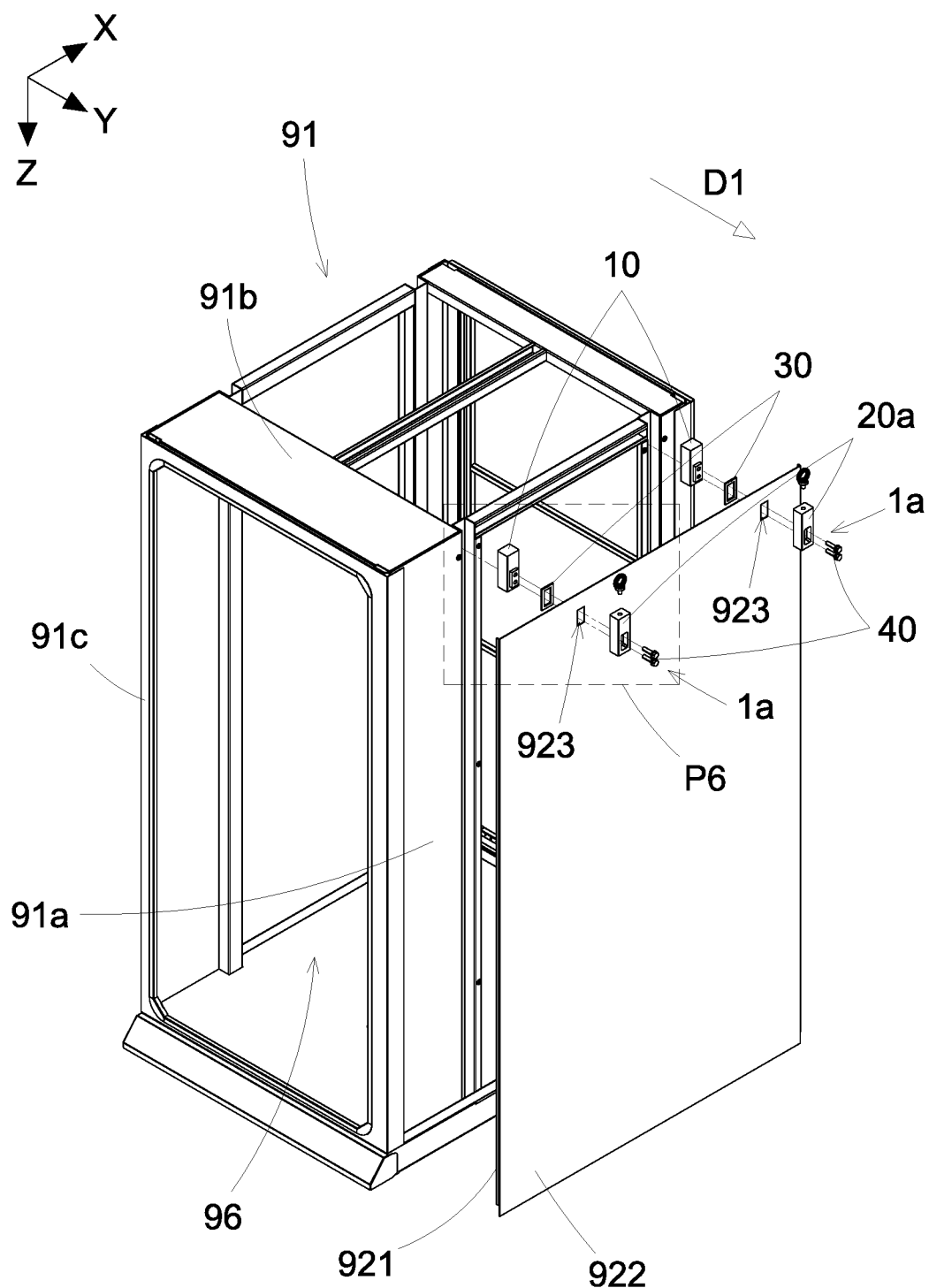
FIG. 7A is an exploded view illustrating a hanging assembly, a cabinet main body and a first lateral plate according to a second embodiment of the present disclosure.
Figure 7B:
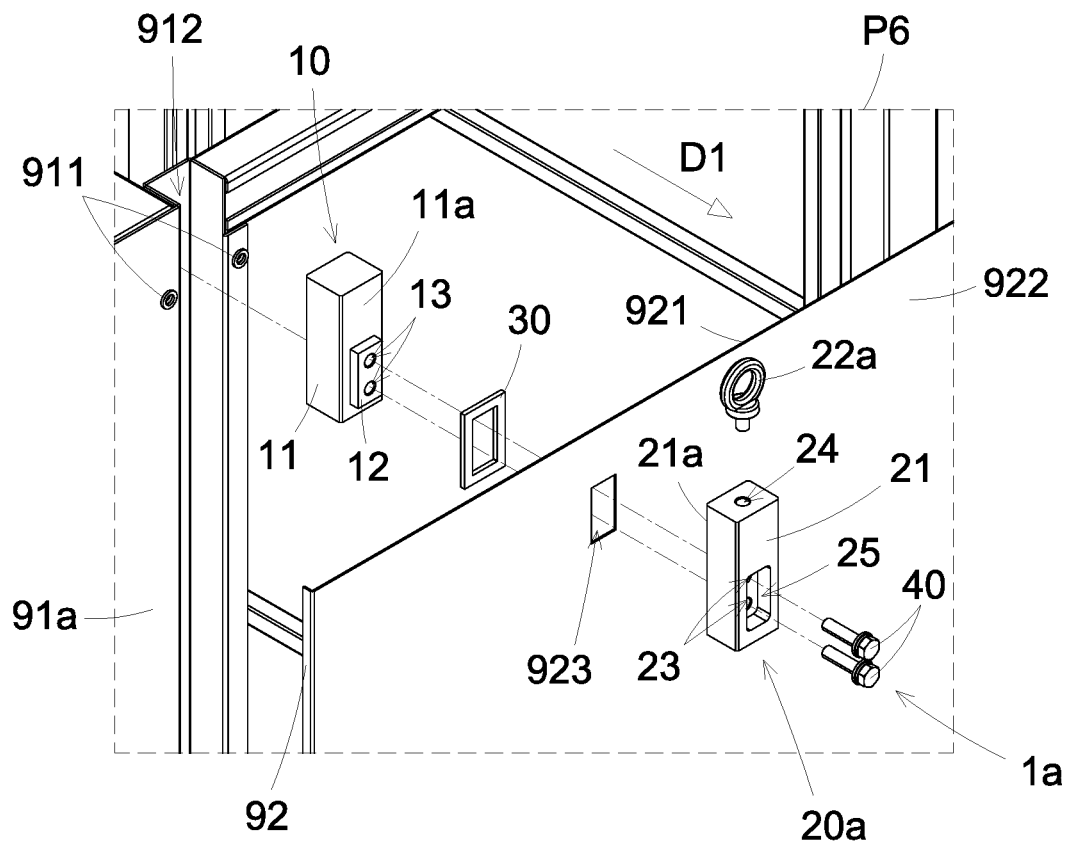
FIG. 7B is an enlarged view of a region P6 shown in FIG. 7A.

Please refer to FIGS. 7A to 7B. FIG. 7A is an exploded view illustrating a hanging assembly, a cabinet main body and a first lateral plate according to a second embodiment of the present disclosure. FIG. 7B is an enlarged view of a region P6 shown in FIG. 7A. In the embodiment, the elements, structures and functions of the hanging assembly 1a are similar to those of the hanging assembly 1 in FIGS. 3A to 3B, and are not redundantly described herein. In the embodiment, the connecting component 20a of the hanging assembly 1a further includes a hanging-component fixing hole 24. The hanging component 24 is disposed on the second main body 21. The hanging component 22a is detachably connected to the second connecting component 20a through the hanging-component fixing hole 24. The detachability of the hanging component 22a facilitates replacement of the components when the components are damaged. Preferably but not exclusively, the hanging component 22a and the hanging-component fixing hole 24 are engaged with each other with a specific structure. Therefore, the anti-theft effect is achieved by simply removing the hanging component 22a after the hanging operation.

In summary, the present disclosure provides a hanging assembly preventing water leakage from a cabinet and facilitating assembling/disassembling and maintenance. The hanging assembly includes a first connecting component and a second connecting component. The first connecting component is fixed to the cabinet, and the second connecting component includes a hanging component. A convex portion of the first connecting component is detachably connected to the second connecting component through an opening disposed on a cabinet lateral plate. The hanging assembly constructed by two detachably connected components facilitates replacement of the components when the components are damaged. Furthermore, with the opening disposed on the cabinet lateral plate, the opening is not easily broken by stress generated during hanging, and the risk of water leakage is further reduced. The convex portion of the first connecting component passes through an elastic body disposed between the first connecting component and the cabinet lateral plate, so as to block external materials from entering the internal space of the cabinet. The sealing performance is improved, and the occurrence of water leakage is further prevented. The cabinet further includes a spacer pushing against the cabinet lateral plate. With the spacer, the elastic body is prevented from being overly compressed by the cabinet lateral plate, and the sealing performance is ensured. A first top plate of the cabinet covers the first connecting component and the cabinet lateral plate from above the cabinet to provide water resistance. Furthermore, the first top plate is partially attached to the outer side of the cabinet lateral plate, and the thickness of the convex portion is greater than the sum of the thickness of the elastic body, the thickness of the cabinet lateral plate and the thickness of the first top plate. With the specific thickness configuration, the first connecting component and the second connecting component are attached to each other when they are fixed, and the stability of the hanging assembly is improved. For further improving the waterproof performance, the cabinet includes a second top plate covering the first top plate and the second connecting component from above the cabinet. In addition, the second top plate is partially sandwiched between a cabinet door and a cabinet main body, so that when the cabinet door is closed and fixed, the second top plate is kept covering the hanging assembly and cannot be detached from the cabinet body. Therefore, the anti-theft effect is achieved.

While the disclosure has been described in terms of what is presently considered to be the most practical and preferred embodiments, it is to be understood that the disclosure needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A cabinet with a hanging assembly, wherein the cabinet comprises a cabinet main body and a first lateral plate for defining an accommodation space, wherein the cabinet main body comprises a first lateral surface, and the first lateral plate is disposed on the first lateral surface and comprises an opening, wherein the hanging assembly comprises:
   a first connecting component fixed to the cabinet main body, wherein the first connecting component comprises a first main body and a convex portion, and the first main body comprises a first surface, wherein the convex portion is disposed on the first surface and passes through the opening of the first lateral plate along a first direction, wherein the first main body is directly fixed to the cabinet main body;
   a second connecting component comprising a second main body and a hanging component, wherein the second main body comprises a second surface, and the second surface of the second main body is detachably connected to the convex portion of the first connecting component through the opening of the first lateral plate, wherein the first lateral plate is disposed between the first connecting component and the second connecting component, and the hanging component is disposed on the second main body; and a fixing component, the first connecting component comprises a first fixing hole, and the second connecting component comprises a second fixing hole, wherein the fixing component is engaged with the first fixing hole and the second fixing hole, respectively.

2. The cabinet with the hanging assembly according to claim 1, wherein the hanging assembly comprises an elastic body disposed between the first connecting component and the first lateral plate, wherein the convex portion has a first thickness, the elastic body has a second thickness, and the first lateral plate has a third thickness, wherein when the first lateral plate is fixed to the cabinet main body, the first thickness is greater than a sum of the second thickness and the third thickness.

3. The cabinet with the hanging assembly according to claim 2, wherein the cabinet further comprises a first top plate covering the first connecting component of the hanging assembly and the first lateral plate along a second direction, wherein the first lateral plate is attached to the first top plate along the first direction, and the second direction is perpendicular to the first direction.

4. The cabinet with the hanging assembly according to claim 3, wherein the first top plate comprises a fourth thickness, wherein the first thickness is greater than a sum of the second thickness, third thickness and the fourth thickness.

5. The cabinet with the hanging assembly according to claim 3, wherein the cabinet further comprises a second top plate covering the first top plate and the hanging assembly along the second direction.

6. The cabinet with the hanging assembly according to claim 5, wherein the cabinet further comprises a second lateral plate at least partially covering the hanging assembly and the second top plate along a third direction, wherein the second lateral plate is configured to be opened or closed, so as to expose or shelter the accommodation space of the cabinet, wherein the third direction is perpendicular to the first direction and the second direction.

7. The cabinet with the hanging assembly according to claim 2, wherein the cabinet further comprises a spacer having a fifth thickness, wherein when the first lateral plate is fixed to the cabinet main body, the spacer pushes against the first lateral plate.

8. The cabinet with the hanging assembly according to claim 1, wherein the first connecting component is fixed to the cabinet by a welding method.

9. The cabinet with the hanging assembly according to claim 1, wherein the cabinet further comprises an accommodation groove, wherein the first connecting component is fixed to the cabinet through the accommodation groove.

10. A cabinet with a hanging assembly, wherein the cabinet comprises a cabinet main body and a first lateral plate for defining an accommodation space, wherein the cabinet main body comprises a first lateral surface, and the first lateral plate is disposed on the first lateral surface and comprises an opening, wherein the hanging assembly comprises:
   a first connecting component fixed to the cabinet main body, wherein the first connecting component comprises a first main body and a convex portion, and the first main body comprises a first surface, wherein the convex portion is disposed on the first surface and passes through the opening of the first lateral plate along a first direction, wherein the first main body is directly fixed to the cabinet main body;

a second connecting component comprising a second main body, a hanging component and a hanging-component fixing hole, wherein the second main body comprises a second surface, and the second surface of the second main body is detachably connected to the convex portion of the first connecting component through the opening of the first lateral plate, wherein the first lateral plate is disposed between the first connecting component and the second connecting component, and the hanging component is disposed on the second main body, and the hanging component is detachably connected to the second main body through the hanging-component fixing hole; and a fixing component, the first connecting component comprises a first fixing hole, and the second connecting component comprises a second fixing hole, wherein the fixing component is engaged with the first fixing hole and the second fixing hole, respectively.

11. The cabinet with the hanging assembly according to claim 10, wherein the hanging assembly comprises an elastic body disposed between the first connecting component and the first lateral plate, wherein the convex portion has a first thickness, the elastic body has a second thickness, and the first lateral plate has a third thickness, wherein when the first lateral plate is fixed to the cabinet main body, the first thickness is greater than a sum of the second thickness and the third thickness.

12. The cabinet with the hanging assembly according to claim 11, wherein the cabinet further comprises a first top plate covering the first connecting component of the hanging assembly and the first lateral plate along a second direction, wherein the first lateral plate is attached to the first top plate along the first direction, and the second direction is perpendicular to the first direction.

13. The cabinet with the hanging assembly according to claim 12, wherein the first top plate comprises a fourth thickness, wherein the first thickness is greater than a sum of the second thickness, third thickness and the fourth thickness.

14. The cabinet with the hanging assembly according to claim 12, wherein the cabinet further comprises a second top plate covering the first top plate and the hanging assembly along the second direction.

15. The cabinet with the hanging assembly according to claim 14, wherein the cabinet further comprises a second lateral plate at least partially covering the hanging assembly and the second top plate along a third direction, wherein the second lateral plate is configured to be opened or closed, so as to expose or shelter the accommodation space of the cabinet, wherein the third direction is perpendicular to the first direction and the second direction.

16. The cabinet with the hanging assembly according to claim 11, wherein the cabinet further comprises a spacer having a fifth thickness, wherein when the first lateral plate is fixed to the cabinet main body, the spacer pushes against the first lateral plate.

17. The cabinet with the hanging assembly according to claim 10, wherein the first connecting component is fixed to the cabinet by a welding method.

18. The cabinet with the hanging assembly according to claim 10, wherein the cabinet further comprises an accommodation groove, wherein the first connecting component is fixed to the cabinet through the accommodation groove.

* * * * *